United States Patent
Yun et al.

(10) Patent No.: US 7,492,152 B2
(45) Date of Patent: Feb. 17, 2009

(54) METHOD OF RECONSTRUCTING PARALLEL MAGNETIC RESONANCE IMAGE USING RADIAL K-SPACE TRAJECTORY, APPARATUS THEREOF, AND COMPUTER READABLE RECORDING MEDIUM RECORDED WITH PROGRAM FOR EXECUTING THE METHOD

(75) Inventors: Seong Dae Yun, Daegu (KR); Hyun Wook Park, Daejeon (KR)

(73) Assignee: Korea Advanced Institute of Science & Technology, Daejeon (KR)

( * ) Notice: Subject to any disclaimer, the term of this patent is extended or adjusted under 35 U.S.C. 154(b) by 0 days.

(21) Appl. No.: 11/616,162

(22) Filed: Dec. 26, 2006

(65) Prior Publication Data

US 2007/0164740 A1 Jul. 19, 2007

(30) Foreign Application Priority Data

Jan. 16, 2006 (KR) .................. 10-2006-0004514

(51) Int. Cl.
*G01V 3/00* (2006.01)

(52) U.S. Cl. .................................. 324/307; 324/318
(58) Field of Classification Search ......... 324/306–322; 600/407–435
See application file for complete search history.

(56) References Cited

U.S. PATENT DOCUMENTS

| | | | | |
|---|---|---|---|---|
| 6,487,435 B2 * | 11/2002 | Mistretta et al. | ............ | 600/420 |
| 6,954,067 B2 * | 10/2005 | Mistretta | ................... | 324/307 |
| 7,046,004 B2 * | 5/2006 | Bieri et al. | ................... | 324/307 |
| 7,132,827 B2 * | 11/2006 | Griswold et al. | ............ | 324/309 |
| 7,132,828 B2 * | 11/2006 | Lustig et al. | ................ | 324/309 |
| 7,148,685 B2 * | 12/2006 | Block et al. | ................. | 324/307 |
| 7,202,663 B2 * | 4/2007 | Huang | ........................ | 324/307 |
| 2001/0027262 A1 * | 10/2001 | Mistretta et al. | .............. | 600/9 |
| 2003/0135103 A1 * | 7/2003 | Mistretta | .................... | 600/410 |
| 2005/0057249 A1 * | 3/2005 | Dale et al. | .................. | 324/307 |
| 2005/0073303 A1 * | 4/2005 | Harer et al. | ................. | 324/307 |
| 2005/0100202 A1 * | 5/2005 | Huang | ........................ | 382/128 |
| 2005/0251023 A1 * | 11/2005 | Kannengiesser et al. | .... | 600/410 |
| 2005/0253579 A1 * | 11/2005 | Block et al. | ................. | 324/307 |
| 2005/0258829 A1 * | 11/2005 | Bieri et al. | ................. | 324/307 |
| 2005/0264287 A1 * | 12/2005 | Griswold et al. | ............ | 324/309 |
| 2005/0270024 A1 * | 12/2005 | Lin | ............................. | 324/307 |
| 2006/0232273 A1 * | 10/2006 | Takizawa et al. | ............ | 324/309 |
| 2006/0264735 A1 * | 11/2006 | Stemmer | ..................... | 600/410 |
| 2007/0013374 A1 * | 1/2007 | Griswold et al. | ............ | 324/309 |
| 2007/0014486 A1 * | 1/2007 | Schiwietz et al. | ........... | 382/276 |
| 2007/0164740 A1 * | 7/2007 | Yun et al. | .................... | 324/307 |

OTHER PUBLICATIONS

K. P. Pruessmann et al., "Advances in Sensitivity Encoding With Arbitrary κ-Space Trajectories," Magnetic Resonance in Medicine vol. 43, (2001), pp. 638-651.

* cited by examiner

Primary Examiner—Brij B. Shrivastav
Assistant Examiner—Tiffany A Fetzner
(74) Attorney, Agent, or Firm—Foley & Lardner LLP

(57) ABSTRACT

The present invention relates to a method of acquiring a parallel magnetic resonance image and a method thereof, and more particularly, to a method of acquiring a magnetic resonance image using a radial k-space trajectory, and an apparatus thereof. A method of reconstructing a parallel magnetic resonance image using a radial k-space trajectory comprises acquiring magnetic resonance data according to the radial k-space trajectory, setting a rotation relation between the radial k-space trajectory and a Cartesian k-space trajectory, and reconstructing a magnetic resonance image from the magnetic resonance data based on the rotation relation.

14 Claims, 3 Drawing Sheets

The rotation relationship between the radial k-space trajectory and a Cartesian k-space trajectory for channel i<sup>th</sup> of the multi-channel coil $$\mathbf{p}_i = \begin{bmatrix} p'_{\theta_1}(x_1) \\ \vdots \\ p'_{\theta_1}(x_N) \\ p'_{\theta_2}(x_1) \\ \vdots \\ p'_{\theta_2}(x_N) \\ \vdots \\ p'_{\theta_N}(x_1) \\ \vdots \\ p'_{\theta_N}(x_N) \end{bmatrix} = \begin{bmatrix} S_i(1,1)c_{\theta_1}(x_1,1,1) & \cdots & S_i(N,N)c_{\theta_1}(x_1,N,N) \\ \vdots & & \vdots \\ S_i(1,1)c_{\theta_1}(x_N,1,1) & \cdots & S_i(N,N)c_{\theta_1}(x_N,N,N) \\ S_i(1,1)c_{\theta_2}(x_1,1,1) & \cdots & S_i(N,N)c_{\theta_2}(x_1,N,N) \\ \vdots & & \vdots \\ S_i(1,1)c_{\theta_2}(x_N,1,1) & \cdots & S_i(N,N)c_{\theta_2}(x_N,N,N) \\ \vdots & & \vdots \\ S_i(1,1)c_{\theta_N}(x_1,1,1) & \cdots & S_i(N,N)c_{\theta_N}(x_1,N,N) \\ \vdots & & \vdots \\ S_i(1,1)c_{\theta_N}(x_N,1,1) & \cdots & S_i(N,N)c_{\theta_N}(x_N,N,N) \end{bmatrix} \begin{bmatrix} f(1,1) \\ \vdots \\ f(1,N) \\ f(2,1) \\ \vdots \\ f(2,N) \\ \vdots \\ f(N,1) \\ \vdots \\ f(N,N) \end{bmatrix} = \mathbf{A}_i \mathbf{f}$$

where $p'_\theta(x_i)$ is the projection data at view angle $\theta$ and a distance $x_i$ of the i-th channel coil, $N$ is the number of samples in both the image and projection data, $V$ is the number of views in projection, and $c_\theta(k,x,y)$ is the coefficient that represents how much $f(x,y)$ contributes to $p'_\theta(x_i)$.

The combined equation of above matrix equation for all channels $$\begin{bmatrix} \mathbf{p}_1 \\ \mathbf{p}_2 \\ \vdots \\ \mathbf{p}_C \end{bmatrix} = \begin{bmatrix} \mathbf{A}_1 \\ \mathbf{A}_2 \\ \vdots \\ \mathbf{A}_C \end{bmatrix} \mathbf{f} \Rightarrow \overline{\mathbf{p}} = \overline{\mathbf{A}} \mathbf{f}$$

where $\overline{\mathbf{p}}$ is a $NVC$-element vector containing $N$ projection data for all $V$ projection views and for $C$ channels, and $\mathbf{f}$ is an $N^2$-element vector representing the reconstructed image. The matrix $\overline{\mathbf{A}}$ has $NVC$ rows and $N^2$ columns. Hence, in order for the equation to have a nontrivial solution, $NVC$ must be equal to or larger than $N^2$ as follows,
∴ $V \geq N/C$ The solution of the equation which is Tikhonove regularized $$\min(\|\overline{\mathbf{A}}\mathbf{f} - \overline{\mathbf{p}}\|^2 + \lambda^2 \|\mathbf{f}\|^2) \Rightarrow \therefore \mathbf{f} = (\overline{\mathbf{A}}^T\overline{\mathbf{A}} + \lambda^2 L^T L)^{-1}\overline{\mathbf{A}}^T\overline{\mathbf{p}}$$

FIG. 2

The rotation relationship between the radial k-space trajectory and a Cartesian k-space trajectory for channel $i^{th}$ of the multi-channel coil $$\mathbf{p}_i = \begin{bmatrix} p^i_{\theta_1}(x_1) \\ \vdots \\ p^i_{\theta_1}(x_N) \\ p^i_{\theta_2}(x_1) \\ \vdots \\ p^i_{\theta_2}(x_N) \\ \vdots \\ p^i_{\theta_V}(x_1) \\ \vdots \\ p^i_{\theta_V}(x_N) \end{bmatrix} = \begin{bmatrix} S_i(1,1)c_{\theta_1}(x_1,1,1) & \cdots & S_i(N,N)c_{\theta_1}(x_1,N,N) \\ \vdots & & \vdots \\ S_i(1,1)c_{\theta_1}(x_N,1,1) & \cdots & S_i(N,N)c_{\theta_1}(x_N,N,N) \\ S_i(1,1)c_{\theta_2}(x_1,1,1) & \cdots & S_i(N,N)c_{\theta_2}(x_1,N,N) \\ \vdots & & \vdots \\ S_i(1,1)c_{\theta_2}(x_N,1,1) & \cdots & S_i(N,N)c_{\theta_2}(x_N,N,N) \\ \vdots & & \vdots \\ S_i(1,1)c_{\theta_V}(x_1,1,1) & \cdots & S_i(N,N)c_{\theta_V}(x_1,N,N) \\ \vdots & & \vdots \\ S_i(1,1)c_{\theta_V}(x_N,1,1) & \cdots & S_i(N,N)c_{\theta_V}(x_N,N,N) \end{bmatrix} \begin{bmatrix} f(1,1) \\ \vdots \\ f(1,N) \\ f(2,1) \\ \vdots \\ f(2,N) \\ \vdots \\ f(N,1) \\ \vdots \\ f(N,N) \end{bmatrix} = \mathbf{A}_i \mathbf{f}$$

where $p^i_\theta(x_k)$ is the projection data at view angle $\theta$ and a distance $x_k$ of the i-th channel coil, $N$ is the number of samples in both the image and projection data, $V$ is the number of views in projection, and $c_\theta(k, x, y)$ is the coefficient that represents how much $f(x, y)$ contributes to $p^i_\theta(x_k)$.

The combined equation of above matrix equation for all channels $$\begin{bmatrix} \mathbf{p}_1 \\ \mathbf{p}_2 \\ \vdots \\ \mathbf{p}_C \end{bmatrix} = \begin{bmatrix} \mathbf{A}_1 \\ \mathbf{A}_2 \\ \vdots \\ \mathbf{A}_C \end{bmatrix} \mathbf{f} \quad \Rightarrow \quad \overline{\mathbf{p}} = \overline{\mathbf{A}} \mathbf{f}$$

where $\overline{\mathbf{p}}$ is a $NVC$-element vector containing $N$ projection data for all $V$ projection views and for $C$ channels, and $\mathbf{f}$ is an $N^2$-element vector representing the reconstructed image. The matrix $\overline{\mathbf{A}}$ has $NVC$ rows and $N^2$ columns. Hence, in order for the equation to have a nontrivial solution, $NVC$ must be equal to or larger than $N^2$ as follows,
$$\therefore V \geq N/C$$

The solution of the equation which is Tikhonove regularized $$\min_{\mathbf{f}} \left( \left\| \overline{\mathbf{A}} \mathbf{f} - \overline{\mathbf{p}} \right\|^2 + \lambda^2 \|\mathbf{f}\|^2 \right) \Rightarrow \therefore \mathbf{f} = \left( \overline{\mathbf{A}}^T \overline{\mathbf{A}} + \lambda^2 \mathbf{L}^T \mathbf{L} \right)^{-1} \overline{\mathbf{A}}^T \overline{\mathbf{p}}$$

METHOD OF RECONSTRUCTING PARALLEL MAGNETIC RESONANCE IMAGE USING RADIAL K-SPACE TRAJECTORY, APPARATUS THEREOF, AND COMPUTER READABLE RECORDING MEDIUM RECORDED WITH PROGRAM FOR EXECUTING THE METHOD

CROSS-REFERENCE

This application claims priority to and the benefit of Korea Patent Application No. 10-2006-0004514, filed on Jan. 16, 2006, the entire contents of which is incorporated herein by reference.

BACKGROUND

1. Field

The present invention relates to a method of acquiring a parallel magnetic resonance image and a method thereof, and more particularly, to a method of acquiring a magnetic resonance image using a radial k-space trajectory, an apparatus thereof, and a computer readable recording medium on which a program for executing the method is recorded.

2. Related Art

Parallel magnetic resonance imaging (MRI) can acquire a magnetic resonance image more quickly than a conventional imaging method. In particular, parallel MRI acquires data using multi-channel coils.

The basic principle of parallel MRI is that a partial amount of data to the desired one is acquired simultaneously from several channels with different characteristics. As a result, an image acquiring time can be shortened. Even though insufficient amounts of data are acquired from individual channels, an image that a user wants to see can be reconstructed by appropriately combining partial amounts data from different channels.

According to conventional MRI, data are acquired from k-space and transformed using a Fourier transform technique.

The term "k-space" refers to a set of frequency component information of an MR image including magnitude information and phase information. A central region of the k-space includes contrast information of an image, and an edge portion of k-space includes information about detailed description of the image and alert information between the groups.

When conventional magnetic resonance data are acquired, the data acquisition takes place through a Cartesian trajectory. One effective parallel MRI for this Cartesian trajectory is a sensitivity encoding (SENSE) method.

Further developed parallel MRI is a method of allowing the implementation of MRI even though the data acquisition takes place through an arbitrary trajectory such as radial or spiral trajectory instead of the Cartesian trajectory.

Such developed MRI is described in an article by Pruessmann K P, Weiger M, Boernert Peter, and Boesiger Peter, entitled "Advances in Sensitivity Encoding with Arbitrary k-Space Trajectories," *Magnetic Resonance in Medicine*, Vol. 46, pp. 638-651, 2001.

According to the MRI described in this article, when data are acquired in k-space not through the Cartesian trajectory but through the radial or spiral trajectory, the k-space is not often sampled equally. Thus, this described MRI undergoes a gridding operation using a Kaiser-Bessel kernel to create the Cartesian trajectory. However, the additional gridding operation may cause many errors, which may become a burden when reconstructing an image.

According to the conventional method as like the MRI described in the above article, data are inferred when the data acquisition is not undergone through the Cartesian trajectory (e.g., the gridding operation in which arbitrary data are inferred based on peripheral data). As a result, an image is not likely to be reconstructed with accuracy.

SUMMARY

Accordingly, embodiments of the present invention provide an apparatus of acquiring a magnetic resonance image and a method thereof allowing effective reconstruction of an MR data acquired through a radial trajectory with multichannel coil using a relation between radial coordinates and Cartesian coordinates.

According to one embodiment of the present invention, a method of acquiring a parallel magnetic resonance image using a radial k-space trajectory comprises acquiring magnetic resonance data according to the radial k-space trajectory, setting a rotation relation between the radial k-space trajectory and a Cartesian k-space trajectory, and reconstructing a magnetic resonance image from the magnetic resonance data based on the rotation relation.

Consistent with one embodiment of the present invention, the magnetic resonance data may comprise N integer number of projection data according to each of projection angles.

Consistent with one embodiment of the present invention, the projection data may comprise data repeatedly acquired for V integer number of the angles different from each other.

Consistent with one embodiment of the present invention, the projection data may comprise data acquired through C integer number of different channels for each of projection angles.

Consistent with one embodiment of the present invention, the rotation relation may be reflected with characteristics of the C integer number of the different channels.

Consistent with one embodiment of the present invention, the projection data may comprise N×V×C number of data for the N integer number of the projection data, the V integer number of the angles different from each other, and the C integer number of the different channels.

Consistent with one embodiment of the present invention, the rotation relation may correspond the N×V×C number of the data to the magnetic resonance image represented in X and Y positioned coordinate points of respective horizontal and vertical axes according to the characteristics of the C integer number of the different channels.

Consistent with one embodiment of the present invention, the rotation relation and the N×V×C number of the data may be operated in a matrix system to acquire the magnetic resonance image represented in the X and Y positioned coordinate points.

Consistent with one embodiment of the present invention, a value of the N×V×C may be substantially the same as a value of X×Y.

Consistent with one embodiment of the present invention, the operation in the matrix system may be performed using an iteration method.

Consistent with one embodiment of the present invention, the operation in the matrix system may be performed using a Tikhonov regularization method.

According to another embodiment of the present invention, an apparatus of acquiring a magnetic resonance image using a radial k-space trajectory comprises a unit configured to acquire magnetic resonance data according to the radial k-space trajectory, a unit configured to set a rotation relation between the radial k-space trajectory and a Cartesian k-space trajectory, and a unit configured to reconstruct a magnetic resonance image from the magnetic resonance data based on the rotation relation.

According to another embodiment of the present invention, a computer readable recording medium on which a program for executing the method of acquiring a magnetic resonance image according to one embodiment of the present invention comprises a computer readable recording medium on which a program for executing the method using the radial k-space trajectory according to one embodiment of the present invention is recorded.

According to another embodiment of the present invention, an apparatus of acquiring a magnetic resonance image is implemented with the method of acquiring a magnetic resonance image using the radial k-space trajectory according to one embodiment of the present invention.

BRIEF DESCRIPTION OF THE DRAWINGS

FIG. 2 illustrates the representation of the relation between the original image and the projection data illustrated in FIG. 1 in the form of a matrix equation.

DETAILED DESCRIPTION

Various embodiments of the present invention will be described with reference to the accompanying drawings.

Figure 1:
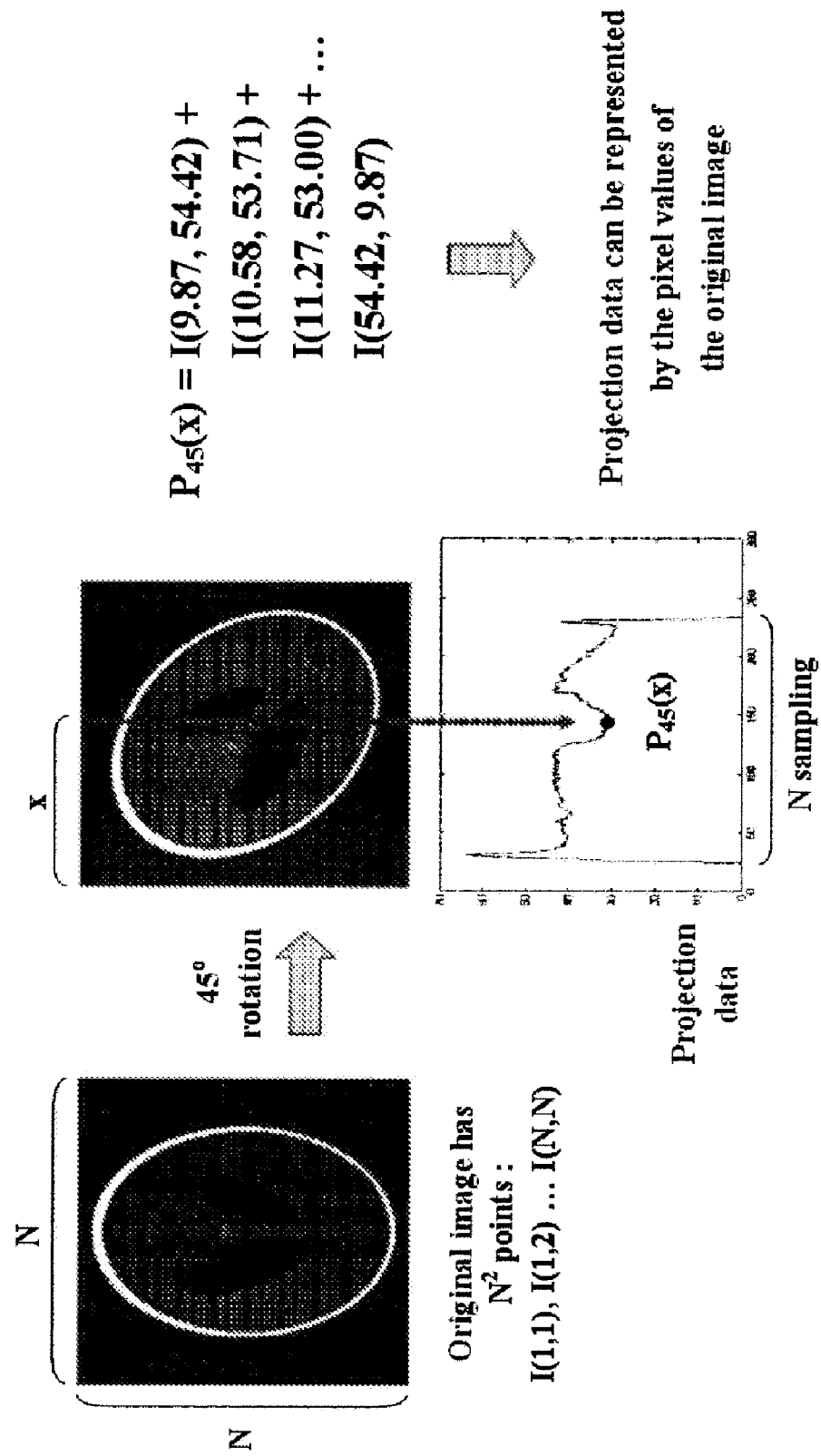
FIG. 1 illustrates a procedure of acquiring data of an original image projected in a radial direction.

FIG. 1 illustrates a procedure of acquiring data of an original image projected in a radial direction.

When data are acquired through a radial trajectory in k-space, projection data in which an image is projected in a radial direction are acquired in view of image-space.

Although the original image can be represented in horizontal and vertical axes (i.e., the X-coordinate and the Y-coordinate, respectively), N number of pixels of an image is assumed to exist in each of the horizontal and vertical axes for easier understanding. Assuming that N number of pixels exists of the original image in each of the horizontal and vertical axes, the total number of pixels of the original image is about $N^2$.

As illustrated on the left side of FIG. 1, the size of the original image is N×N in the horizontal and vertical axes. If the original image is rotated counter clockwise by about 45 degrees, the original image changes into an image illustrated in the center of FIG. 1. When the original image is rotated as above, projection data illustrated in the below of the image at the center of FIG. 1 are acquired.

When the acquired projection data are sampled in N number of points, N number of projection data can be obtained with respect to a certain angle.

In a mathematical equation expressed on the right side of FIG. 1, I(x, y) represents a value of the original image positioned in x and y coordinate points of the respective horizontal and vertical axes. $P_{45}(x)$ represents a value of the projection data positioned in an x coordinate point of the horizontal axis. Therefore, the projection data can be represented in the value of the original image (i.e., I(x, y)) as defined in the mathematical equation on the right side of FIG. 1.

A final image (i.e., desired image) can be obtained by reconstructing the original image illustrated on the left side of FIG. 1 based on the projection data. Hence, if the size of the original image is about N×N, unknown values are about $N^2$, and thus, the required number of projection data is also about $N^2$.

As described above, since N number of projection data is acquired with respect to one angle, N number of projection data needs to be acquired for N number of different angles to acquire about $N^2$ number of projection data.

FIG. 2 illustrates the representation of the relation between the original image and the projection data illustrated in FIG. 1 in the form of a matrix equation.

In the matrix relation, $\bar{p}$ is a vector of collected projection data. In the vector, $\bar{p}$, i in $P_\theta^i$, $(x_k)$ is an index representing a channel according to characteristics of parallel magnetic resonance data for each channel. θ represents an index of angle, and $x_k$ represents a projection data for the position.

N, V and C represent the number of sampled projection data, the number of angles and the number of channels, respectively.

For instance, in the assumption that the number of channels is C, and N number of projection data are sampled with respect to one angle and repeatedly acquired for V number of different angles, the total number of projection data is about N×V×C.

In FIG. 2, f is a vector of image data to be found. If the size of an image is about N in each of the horizontal and vertical axes, the total unknown values are about $N^2$.

A matrix $\bar{A}$ represents a value exhibiting a characteristic of i-th channel positioned in x and y coordinate points of the respective horizontal and vertical axes.

Therefore, the matrix establishing the relation between the original image and the projection data is the matrix $\bar{A}$ in FIG. 2. The size of the matrix $\bar{A}$ is determined to be about (N×V×C)×$N^2$. Thus, from the matrix system, a minimum condition for determining the solution is: N×V×C=$N^2$. In other words, V×C=N.

As C (i.e., the number of channels) increases, a value of V decreases as much as the increase. Hence, an image can be reconstructed even though the number of angles is small. As a result, an image acquisition time can be shortened, and parallel MRI can be implemented.

The solution of the matrix equation expressed in FIG. 2 can be found using an iteration method. For example, a method implemented in one embodiment of the present invention may proceed in an iteration mode that minimizes mean-square-errors of $\bar{A}f$ and $\bar{p}$, and algorithm may use a conjugate gradient method.

In an attempt to find the solution of the matrix equation, if the projection data include noise, the effect of noise may increase. Hence, a Tikhonov regularization method may be used to suppress the noise.

When the solution of the matrix equation is found using the iteration and regularization method, a value of f (i.e., desired image) can be found.

Figure 3:
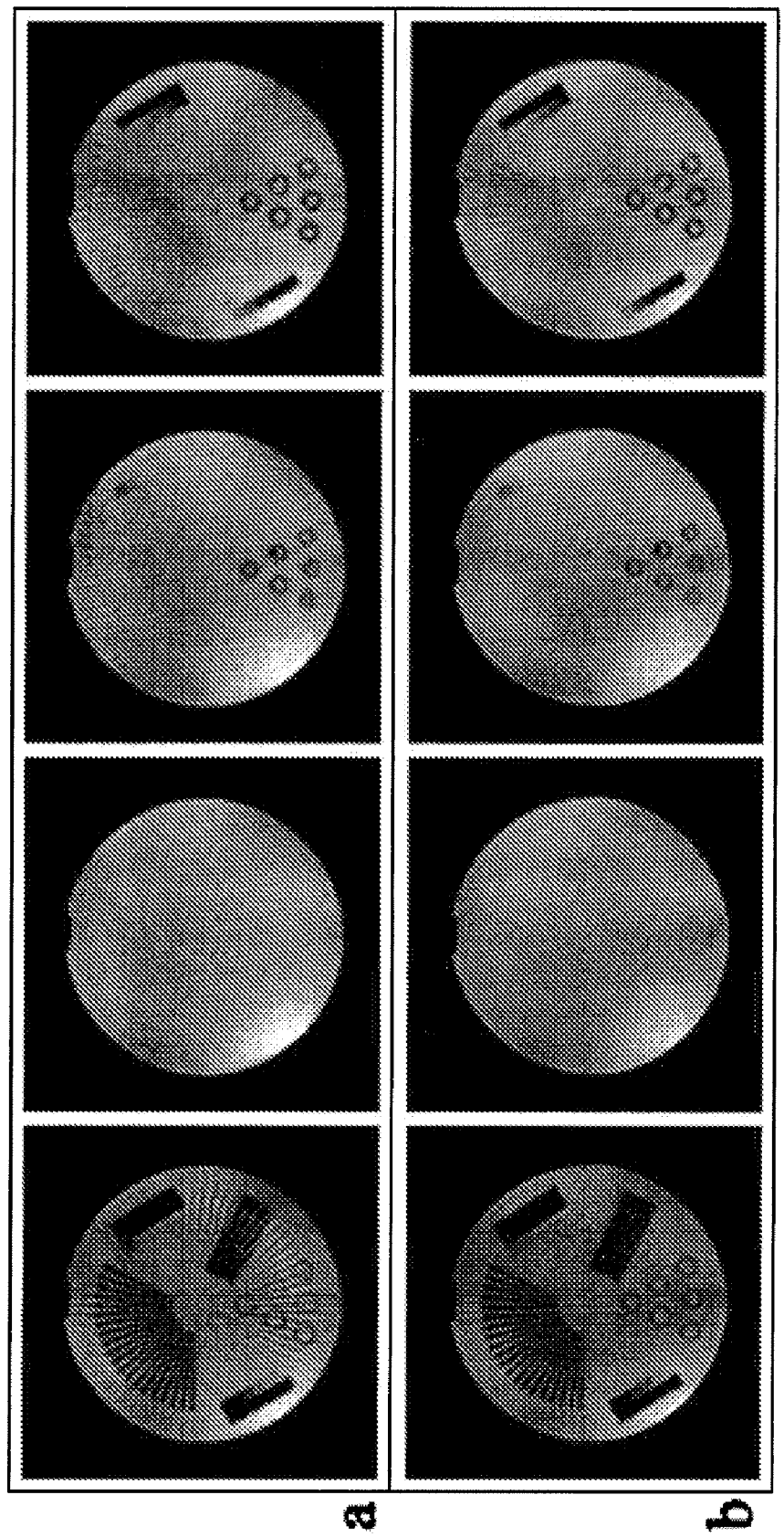
FIG. 3 illustrates comparison results between images reconstructed by the conventional method and by an embodied method consistent with the present invention.

FIG. 3 illustrates comparison results between images reconstructed by the conventional method and image reconstructed by an embodied method consistent with the present invention.

A Radon transform method is one conventional method. However, this Radon transform method is not for parallel magnetic resonance imaging, and is being widely used in reconstructing data acquired simply through a radial trajectory. FIG. 3a illustrates reconstructed images based on N/2 number of projection data in accordance with the conventional method. FIG. 3b illustrates reconstructed images based on about N/2 number of projection data in accordance with an embodiment method of the present invention.

The reconstructed images according to the conventional method are compared with those according to the embodied method of the present invention to show the resolution quality of the reconstructed images according to the present embodiment are superior to that of the reconstructed image according to the convention method even with using same number of projection data.

In FIG. 3, when 4 channel coils are used, the number of sampling data, N, is about 128, the number of angles, V, is about 128, and the number of slices is about 4. Thus, 4 reconstructed images having the resolution of about 128×128 are provided.

The results illustrated in FIG. 3a are reconstructed images using the conventional method. More specifically, Radon transform is applied to projection data provided from each channel so as to obtain resultant images. The resultant images are averaged to provide one image. Since the number of slices is 4, the above operation is repeated 4 times.

The results illustrated in FIG. 3b are reconstructed images according to the embodiment of the present invention. The initial number of projection data is about 128. However, since the illustration in FIG. 3 is targeted to acquire reconstruct images using the less number of angles, about 64 of the 128 projection data are used.

As mentioned, it is targeted to show that the reconstructed images according to the present embodiment have superior quality to the reconstructed images according to the convention when using same number of angles. The resultant images of FIG. 3b have substantially better quality than that of FIG. 3a.

According to various embodiments of the present invention, a method of acquiring a parallel magnetic resonance image using a radial k-space trajectory allows the implementation of MRI to magnetic resonance data acquired through a radial k-space trajectory. A gridding operation usually performed to reconstruct a MR image is not necessary for this method. Even though phase information of data is not provided, magnetic resonance images can be effectively reconstructed simply using magnitude information. Also, images with good resolution quality can be provided within a short period of time.

In addition, since images can be reconstructed only using the magnitude information without the phase information of data, a motion artifact shown in DTI images can be reduced.

Although the present invention has been described with reference to certain exemplary embodiments, it will be understood by those skilled in the art that a variety of modifications and variations may be made to the present invention without departing from the spirit or scope of the present invention defined in the appended claims, and their equivalents.

What is claimed is:

1. A method of acquiring a magnetic resonance image using a radial k-space trajectory, the method comprising:
    acquiring magnetic resonance data according to the radial k-space trajectory;
    setting a rotational relationship between the radial k-space trajectory and a Cartesian k-space trajectory in a system; and
    reconstructing a magnetic resonance image from only magnitude information of the magnetic resonance data based on the rotational relationship, without gridding the data acquired according to the radial k-space trajectory to a Cartesian trajectory, during the reconstruction process.

2. The method of claim 1, wherein the magnetic resonance data comprise N integer number of projection data according to each of projection angles.

3. The method of claim 2, wherein the projection data comprise data repeatedly acquired for V integer number of the angles different from each other.

4. The method of claim 3, wherein the projection data comprise data acquired through C integer number of different channels for each of projection angles.

5. The method of claim 4, wherein the rotation relation is reflected with characteristics of the C integer number of the different channels.

6. The method of claim 5, wherein the projection data comprise about N×V×C number of data comprising data for the N integer number of the projection data, the V integer number of the angles different from each other, and the C integer number of the different channels.

7. The method of claim 6, wherein the rotation relation corresponds the N×V×C number of the data to the magnetic resonance image represented in X and Y positioned coordinate points of respective horizontal and vertical axes according to the characteristics of the C integer number of the different channels.

8. The method of claim 7, wherein the rotation relation and the N×V×C number of the data are operated in a matrix system to reconstruct the magnetic resonance image represented in the X and Y positioned coordinate points.

9. The method of claim 8, wherein a value of the N×V×C is substantially the same as a value of X×Y.

10. The method of claim 8, wherein the operation in the matrix system is performed using an iteration method.

11. The method of claim 8, wherein the operation in the matrix system is performed using a Tikhonov regularization method.

12. An apparatus of acquiring a magnetic resonance image, the apparatus implemented with the method according to claim 1.

13. A computer readable recording medium on which a program for executing the method according to claim 1 is recorded.

14. An apparatus of acquiring a magnetic resonance image using a radial k-space trajectory, the apparatus comprising:
    a means configured to acquire magnetic resonance data according to the radial k-space trajectory;
    a means configured to set a rotation relation between the radial k-space trajectory and
    a Cartesian k-space trajectory; and a means configured to reconstruct a magnetic resonance image from only magnitude information of the magnetic resonance data based on the rotational relationship without gridding the data acquired according to the radial k-space trajectory into a Cartesian trajectory durning the reconstruction process.

* * * * *